United States Patent
Wang et al.

(10) Patent No.: US 11,227,525 B2
(45) Date of Patent: Jan. 18, 2022

(54) SHIFT REGISTER UNIT AND METHOD FOR DRIVING THE SAME, GATE DRIVING CIRCUIT AND METHOD FOR DRIVING THE SAME, AND DISPLAY APPARATUS

(71) Applicants: Ordos Yuansheng Optoelectronics Co., Ltd., Inner Mongolia (CN); BOE TECHNOLOGY GROUP CO., LTD., Beijing (CN)

(72) Inventors: Zhichong Wang, Beijing (CN); Fuqiang Li, Beijing (CN); Peng Liu, Beijing (CN); Jing Feng, Beijing (CN); Xinglong Luan, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/769,910

(22) PCT Filed: Jan. 8, 2020

(86) PCT No.: PCT/CN2020/070888
§ 371 (c)(1),
(2) Date: Jun. 4, 2020

(87) PCT Pub. No.: WO2020/156068
PCT Pub. Date: Aug. 6, 2020

(65) Prior Publication Data
US 2021/0209988 A1 Jul. 8, 2021

(30) Foreign Application Priority Data
Feb. 1, 2019 (CN) .......................... 201910104999.7

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2300/0426* (2013.01);
(Continued)

(58) Field of Classification Search
CPC .............. G09G 3/3233; G09G 3/3266; G09G 2300/0819; G09G 2300/0842;
(Continued)

(56) References Cited

U.S. PATENT DOCUMENTS 9,001,108 B2   4/2015 Jang
9,449,558 B2 * 9/2016 Choi .................... G09G 3/3677
(Continued)

FOREIGN PATENT DOCUMENTS

| CN | 102831860 A | 12/2012 |
|----|-------------|---------|
| CN | 103247255 A | 8/2013  |

(Continued)

*Primary Examiner* — Nelson M Rosario
(74) *Attorney, Agent, or Firm* — Westerman, Hattori, Daniels & Adrian, LLP

(57) ABSTRACT

A shift register unit and a method for driving the same, a gate driving circuit and a method for driving the same, and a display apparatus. The shift register unit includes: an input sub-circuit configured to transmit a signal at an input signal terminal to a first node under control of a voltage at a second node; a discharging control sub-circuit configured to transmit a signal at a first clock signal terminal to the second node under control of a voltage at the first node; a discharging sub-circuit configured to transmit a signal at a first constant voltage signal terminal to an output signal terminal under control of the voltage at the second node; and an output (Continued)

sub-circuit configured to transmit a signal at a second clock signal terminal to the output signal terminal under control of the voltage at the first node.

13 Claims, 10 Drawing Sheets

(52) U.S. Cl.
CPC . *G09G 2300/08* (2013.01); *G09G 2310/0267* (2013.01); *G09G 2310/0286* (2013.01); *G09G 2310/08* (2013.01)

(58) Field of Classification Search
CPC ... G09G 2300/0861; G09G 2310/0262; G09G 2310/0278; G09G 2310/0286; G09G 3/20; G09G 3/3225; G09G 3/3648; G09G 3/3677; G09G 2300/0408; G09G 2300/0809; G09G 2310/0267; G09G 2310/061; G09G 2310/08; G09G 2320/0219; G11C 19/28; G11C 19/287

See application file for complete search history.

(56) References Cited

U.S. PATENT DOCUMENTS

| | | |
|---|---|---|
| 2013/0207956 A1 | 8/2013 | Jang |
| 2014/0043373 A1* | 2/2014 | Kim .................... G09G 5/00 345/690 |
| 2018/0068635 A1 | 3/2018 | Zhu |

FOREIGN PATENT DOCUMENTS

| | | |
|---|---|---|
| CN | 107103870 A | 8/2017 |
| CN | 108806584 A | 11/2018 |
| JP | 2010186551 A | 8/2010 |

* cited by examiner

900

1000

_US 11,227,525 B2_

SHIFT REGISTER UNIT AND METHOD FOR DRIVING THE SAME, GATE DRIVING CIRCUIT AND METHOD FOR DRIVING THE SAME, AND DISPLAY APPARATUS

CROSS-REFERENCE TO RELATED APPLICATION(S)

This application claims priority to the Chinese Patent Application No. CN201910104999.7, filed on Feb. 1, 2019, which is incorporated herein by reference in its entirety.

TECHNICAL FIELD

The present disclosure relates to the field of display technology, and more particularly, to a shift register unit and a method for driving the same, a gate driving circuit and a method for driving the same, and a display apparatus.

BACKGROUND

In a Thin Film Transistor (TFT)-based Liquid Crystal Device (LCD) or Active Matrix Organic Light Emitting Display (AMOLED), a gate driving circuit which drives a gate may be formed on a display panel to constitute a Gate drive On Array (GOA). The gate driving circuit comprises a plurality of cascaded shift register units, and each of the shift register units comprises a plurality of TFTs to implement functions such as inputting, discharging, outputting, resetting and de-noising etc. respectively. However, as requirements for parameters of a panel such as a resolution etc. continue to increase, a larger number of transistors and signal wiring have hindered the improvement of the panel.

SUMMARY

The present disclosure proposes a shift register unit and a method for driving the same, a gate driving circuit and a method for driving the same, and a display apparatus.

According to an aspect of the present disclosure, there is provided a shift register unit, comprising: an input sub-circuit electrically coupled to an input signal terminal, a first node and a second node, and configured to transmit an input signal at the input signal terminal to the first node under control of a voltage at the second node; a discharging control sub-circuit electrically coupled to a first clock signal terminal, the first node and the second node, and configured to transmit a first clock signal at the first clock signal terminal to the second node under control of a voltage at the first node; a discharging sub-circuit electrically coupled to the second node, a first constant voltage signal terminal and an output signal terminal, and configured to transmit a first constant voltage signal at the first constant voltage signal terminal to the output signal terminal under control of the voltage at the second node; and an output sub-circuit electrically coupled to the first node, a second clock signal terminal and the output signal terminal, and configured to transmit a second clock signal at the second clock signal terminal to the output signal terminal under control of the voltage at the first node, wherein the discharging control sub-circuit comprises a first transistor and a second transistor, the first transistor has a control electrode electrically coupled to the first node, a first electrode electrically coupled to the first clock signal terminal, and a second electrode electrically coupled to the second node, and the second transistor has a second electrode electrically coupled to the second node.

In some embodiments, the discharging control sub-circuit is further configured to transmit the first clock signal to the second node under control of the first clock signal.

In the embodiments, the second transistor has a control electrode and a first electrode both electrically coupled to the first clock signal terminal.

In some other embodiments, the discharging control sub-circuit is further electrically coupled to a second constant voltage signal terminal, and is further configured to transmit a second constant voltage signal at the second constant voltage signal terminal to the second node under control of the first clock signal.

In the embodiments, the second transistor has a control electrode electrically coupled to the first clock signal terminal, a first electrode electrically coupled to the second constant voltage signal terminal.

In some embodiments, the input sub-circuit comprises an input transistor. The input transistor has a control electrode electrically coupled to the second node, a first electrode electrically coupled to the input signal terminal, and a second electrode electrically coupled to the first node.

In some embodiments, the output sub-circuit comprises an output transistor and a first capacitor. The output transistor has a control electrode electrically coupled to the first node, a first electrode electrically coupled to the second clock signal terminal, and a second electrode electrically coupled to the output signal terminal. The first capacitor has one terminal electrically coupled to the first node, and the other terminal electrically coupled to the output signal terminal.

In some embodiments, the discharging sub-circuit comprises a discharging transistor. The discharging transistor has a control electrode electrically coupled to the second node, a first electrode electrically coupled to the first constant voltage signal terminal, and a second electrode electrically coupled to the output signal terminal.

In some embodiments, the discharging sub-circuit further comprises a second capacitor. The second capacitor has one terminal electrically coupled to the second node, and the other terminal electrically coupled to the first constant voltage signal terminal.

In some embodiments, the input sub-circuit comprises an input transistor, the input transistor has a control electrode electrically coupled to the second node, a first electrode electrically coupled to the input signal terminal, and a second electrode electrically coupled to the first node, the output sub-circuit comprises an output transistor and a first capacitor, the output transistor has a control electrode electrically coupled to the first node, a first electrode electrically coupled to the second clock signal terminal, and a second electrode electrically coupled to the output signal terminal, and the first capacitor has one terminal electrically coupled to the first node, and the other terminal electrically coupled to the output signal terminal, and the discharging sub-circuit comprises a discharging transistor and a second capacitor, the discharging transistor has a control electrode electrically coupled to the second node, a first electrode electrically coupled to the first constant voltage signal terminal, and a second electrode electrically coupled to the output signal terminal, and the second capacitor has one terminal electrically coupled to the second node, and the other terminal electrically coupled to the first constant voltage signal terminal.

According to another aspect of the present disclosure, there is provided a gate driving circuit. The gate driving circuit comprises a plurality of cascaded shift register units according to any of the above embodiments. Except for a first stage of shift register unit, each stage of shift register unit receives an output signal from an output signal terminal of a previous stage of shift register unit as an input signal of the current stage of shift register unit, and the first stage of shift register unit receives a frame start signal as an input signal. A first clock signal terminal of each stage of shift register unit is coupled to one of a first clock signal line and a second clock signal line, and a second clock signal terminal of each stage of shift register unit is coupled to the other of the first clock signal line and the second clock signal line, wherein first clock signal terminals in adjacent two stages of shift register units are coupled to different clock signal lines.

According to another aspect of the present disclosure, there is provided a display apparatus. The display apparatus comprises the gate driving circuit according to any of the above embodiments and a display panel.

According to another aspect of the present disclosure, there is provided a method for driving the shift register unit according to any of the above embodiments. The driving method comprises: during an input period, transmitting the input signal to the first node through the input sub-circuit to charge the first node to a first valid level under control of the first clock signal; during an output period, transmitting the second clock signal to the output signal terminal through the output sub-circuit to be output as an output signal, and charging the first node to a second valid level; and during a reset period, transmitting the input signal to the first node through the input sub-circuit to reset the first node to an invalid level under control of the voltage at the second node.

In some embodiments, after the reset period, the input signal is maintained to be transmitted to the first node to continuously de-noise the first node under control of the voltage at the second node.

According to another aspect of the present disclosure, there is provided a method for driving the gate driving circuit according to any of the above embodiments. The driving method comprises: providing a frame start signal to an input signal terminal of the first stage of shift register; and providing clock signals to clock signal terminals in all the stages of shift register units through the first clock signal line and the second clock signal line.

In some embodiments, a phase of a signal from the first clock signal line differs from a phase of a signal from the second clock signal line by a half of a clock cycle, and a first edge of a clock signal provided to a first clock signal terminal of the first stage of shift register during a first cycle is synchronized with a first edge of the frame start signal.

In some embodiments, a duty ratio of the frame start signal is adjustable.

BRIEF DESCRIPTION OF THE ACCOMPANYING DRAWINGS

In order to more clearly explain the technical solutions in the embodiments of the present disclosure or in the related art, the accompanying drawings needed to be used in the description of the embodiments will be briefly introduced below. Obviously, the accompanying drawings in the following description are only some embodiments of the present disclosure. Other accompanying drawings may be obtained by those of ordinary skill in the art according to these accompanying drawings without any creative work. In the accompanying drawings.

DETAILED DESCRIPTION

Figure 1:
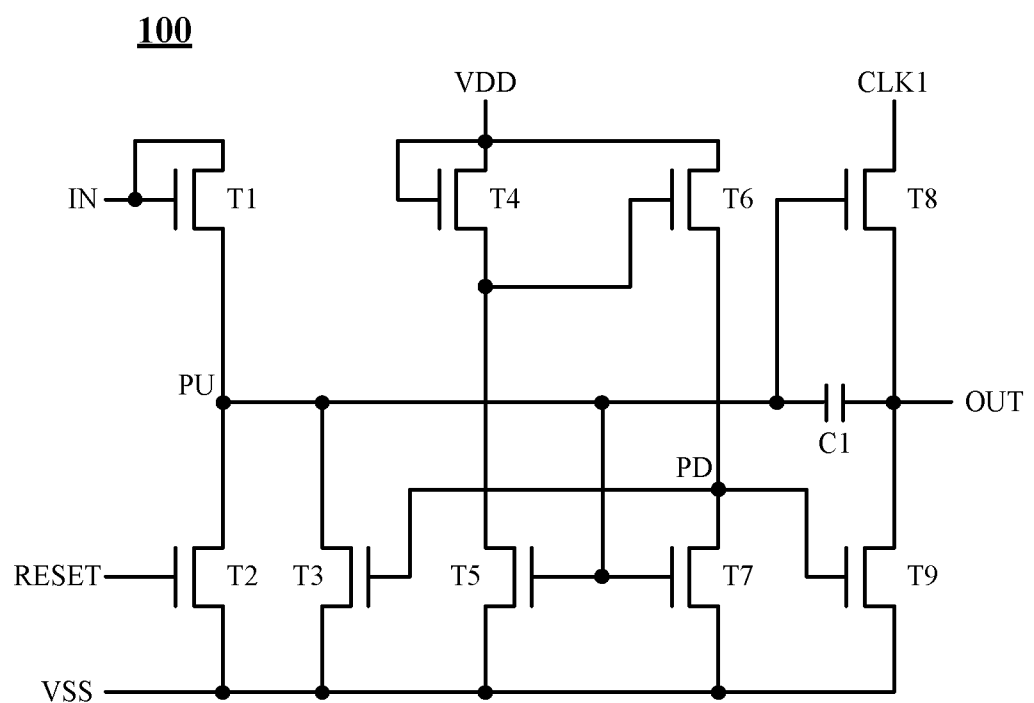
FIG. 1 illustrates a schematic circuit diagram of a shift register unit in the related art.

In order to make the purposes, technical solutions, and advantages of the embodiments of the present disclosure more clear, the technical solutions in the embodiments of the present disclosure will be described clearly and completely in conjunction with the accompanying drawings in the embodiments of the present disclosure. Obviously, the embodiments described are a part of the embodiments of the present disclosure, instead of all the embodiments of the present disclosure. All other embodiments obtained by those of ordinary skill in the art based on the described embodiments of the present disclosure without any creative work fall within the protection scope of the present disclosure. It should be illustrated that throughout the accompanying drawings, the same elements are denoted by the same or similar reference signs. In the following description, some embodiments are for descriptive purposes only, and should not be construed as limiting the present disclosure, but are merely examples of the embodiments of the present disclosure. The conventional structure or configuration will be omitted when it may cause confusion to the understanding of the present disclosure. It should be illustrated that shapes and sizes of components in the figures do not reflect true sizes and proportions, but only illustrate contents of the embodiments of the present disclosure.

Unless otherwise defined, the technical terms or scientific terms used in the embodiments of the present disclosure should have a common meaning understood by those skilled in the art. The terms "first", "second" and similar words used in the embodiments of the present disclosure do not indicate any order, quantity or importance, but are only used to distinguish different components.

In addition, in the description of the embodiments of the present disclosure, the term "connected" or "electrically connected" may refer to that two components are directly connected or electrically connected, or may refer to that two components are connected or electrically connected via one or more other components. In addition, the two components may be connected or electrically connected in a wired or wireless manner.

Transistors used in the embodiments of the present disclosure may all be thin film transistors, field effect transistors, or other devices having the same characteristics. According to functions in a circuit, the transistors used in the embodiments of the present disclosure are mainly switching transistors. Each of the transistors used in the present disclosure comprises "a control electrode", "a first electrode" and "a second electrode". In an embodiment in which a thin film transistor is used, the control electrode refers to a gate of the thin film transistor, the first electrode refers to one of a source and a drain of the thin film transistor, and the second electrode refers to the other of the source and the drain of the thin film transistor. Since the source and the drain of the thin film transistor used here are symmetrical, the source and the drain may be interchanged. In the following examples, description will be made by taking N-type thin film transistors as an example. Similarly, in other embodiments, the technical solutions according to the present disclosure may also be implemented using ID-type thin film transistors. It may be understood by those skilled in the art that in this case, the technical solutions according to the present disclosure may also be implemented by inverting (and/or performing other adaptive modifications to) input signals, clock signals, and constant voltage signals etc.

In the embodiments of the present disclosure, a clock signal is a periodic signal. In one cycle, the clock signal is divided into a high level period and a low level period appearing successively by two signal edges (a first edge and a second edge lagging behind the first edge). Further, in the description of the embodiments of the present disclosure, the terms "valid level" and "invalid level" are levels which cause a relevant transistor to be turned on and turned off respectively. In the present disclosure, "first valid level" and "second valid level" are only used to distinguish different amplitudes of the two valid levels. In the following, since an N-type thin film transistor is used as an example, the "valid level" is a high level and the "invalid level" is a low level.

Correspondingly, hereinafter, since the N-type thin film transistor is used as an example, a signal provided at a "first constant voltage signal terminal" for providing an invalid driving level is a low level signal vgl, and a signal provided at a "second constant voltage signal terminal" for providing a valid driving level is a high level signal vgh. Without loss of generality, for convenience of description, hereinafter, an input signal and a clock signal which may be switched between a high level and a low level have a high level which is also set to vgh, and a low level which is also set to vgl. It should be understood by those skilled in the art that in some embodiments, the respective signals may have high levels which are different from each other, and low levels which are also be different from each other.

Generally, in a shift register unit, charging and discharging of an output signal terminal may be controlled by adjusting voltages at two nodes (for example, a first node and a second node). In some embodiments, the charging of the output signal terminal may be realized by changing the voltage at the first node, and the discharging of the output signal terminal may be realized by changing the voltage at the second node. In the embodiments of the present disclosure, since the N-type thin film transistor is used as an example, the first node for controlling the charging may be exemplarily represented as a pull-up node PU, and the second node for controlling the discharging may be exemplarily represented as a pull-down node PD. Similarly, in an embodiment in which a P-type thin film transistor is used as an example, the first node may be exemplarily represented as a pull-down node PD, and the second node may be exemplarily represented as a pull-up node PU.

The present disclosure will be described in detail below with reference to the accompanying drawings.

FIG. 1 illustrates a schematic circuit diagram of a shift register unit 100 in the related art. As shown in FIG. 1, a clock signal at a clock signal terminal CLK1 may provide a high level to an output signal terminal OUT through a thin film transistor T8 under control of a pull-up node PU, and a signal at a constant voltage signal terminal VSS may provide a low level to the output signal terminal OUT through a thin film transistor T9 under control of a pull-down node PD. Thus, a signal output at the output signal terminal OUT may be controlled by controlling a timing of potentials at the pull-up node PU and the pull-down node PD. In order to achieve proper control of a voltage at the pull-up node PU, during an input phase, the pull-up node PU is charged to a high level through the input transistor T1 by using an input signal; during a reset phase, the pull-up node PU is reset to a low level through a reset transistor T2 by using the low level signal at VSS; and a function of de-noising the pull-up node PU is further realized through a thin film transistor T3.

In addition, in order to achieve proper control of a voltage at the pull-down node PD, a high level at VDD and a low level at VSS are transmitted to the pull-down node PD respectively through a sub-circuit structure formed by thin film transistors T4, T5, T6 and T7. A final voltage at the pull-down node PD is determined by channel width-to-length ratios of T6 and T7. Appropriate setting of the voltage at the point PD may be achieved by appropriately setting the width-to-length ratios. However, during a period in which both the high level at VDD and the low level at VSS are transmitted to the pull-down node PD, short-circuit current is formed in the circuit structure, which may increase power consumption of the shift register unit.

Thus, in order to control the output at the output signal terminal, a plurality of thin film transistors are used in the shift register unit 100 to implement functions such as inputting, resetting, de-noising, discharging etc. respectively. The large number of thin film transistors are not conducive to improvement of performance of a panel in subsequent design. In addition, the presence of short-circuit current in the shift register unit 100 affects the power consumption level of the shift register unit.

Figure 2:
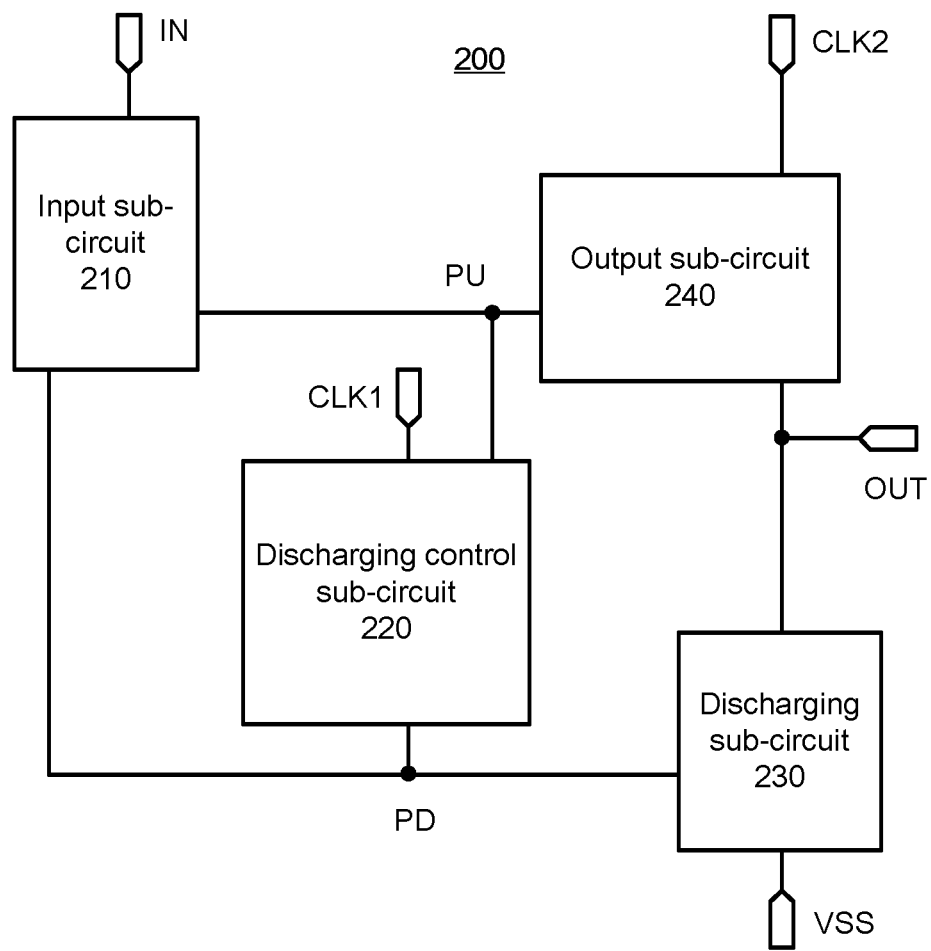
FIG. 2 illustrates a schematic structural diagram of a shift register according to an embodiment of the present disclosure.

FIG. 2 illustrates a schematic structural diagram of a shift register 200 according to an embodiment of the present disclosure.

As shown in FIG. 2, the shift register unit 200 comprises an input sub-circuit 210, a discharging control sub-circuit 220, a discharging sub-circuit 230 and an output sub-circuit 240.

The input sub-circuit 210 is electrically coupled to an input signal terminal IN, a pull-up node PU, and a pull-down node PD. The input sub-circuit 210 is configured to transmit an input signal at the input signal terminal IN to the pull-up node PU under control of a voltage at the pull-down node PD.

The discharging control sub-circuit 220 is electrically coupled to a first clock signal terminal CLK1, the pull-up node PU and the pull-down node PD. The discharging control sub-circuit 220 is configured to transmit a first clock signal at the first clock signal terminal CLK1 to the pull-down node PD under control of the voltage at the pull-up node PU.

In some embodiments, the discharging control sub-circuit 220 is further configured to transmit the first clock signal itself to the pull-down node PD under control of the first clock signal.

The discharging sub-circuit 230 is electrically coupled to the pull-down node PD, a first constant voltage signal terminal VSS, and an output signal terminal OUT. The discharging sub-circuit 230 is configured to transmit a first constant voltage signal at the first constant voltage signal terminal VSS to the output signal terminal OUT under control of the voltage at the pull-down node PD.

The output sub-circuit 240 is electrically coupled to the pull-up node PU, a second clock signal terminal CLK2, and the output signal terminal OUT. The output sub-circuit 240 is configured to transmit a second clock signal at the second clock signal terminal CLK2 to the output signal terminal OUT under control of the voltage at the pull-up node PU.

Figure 3:
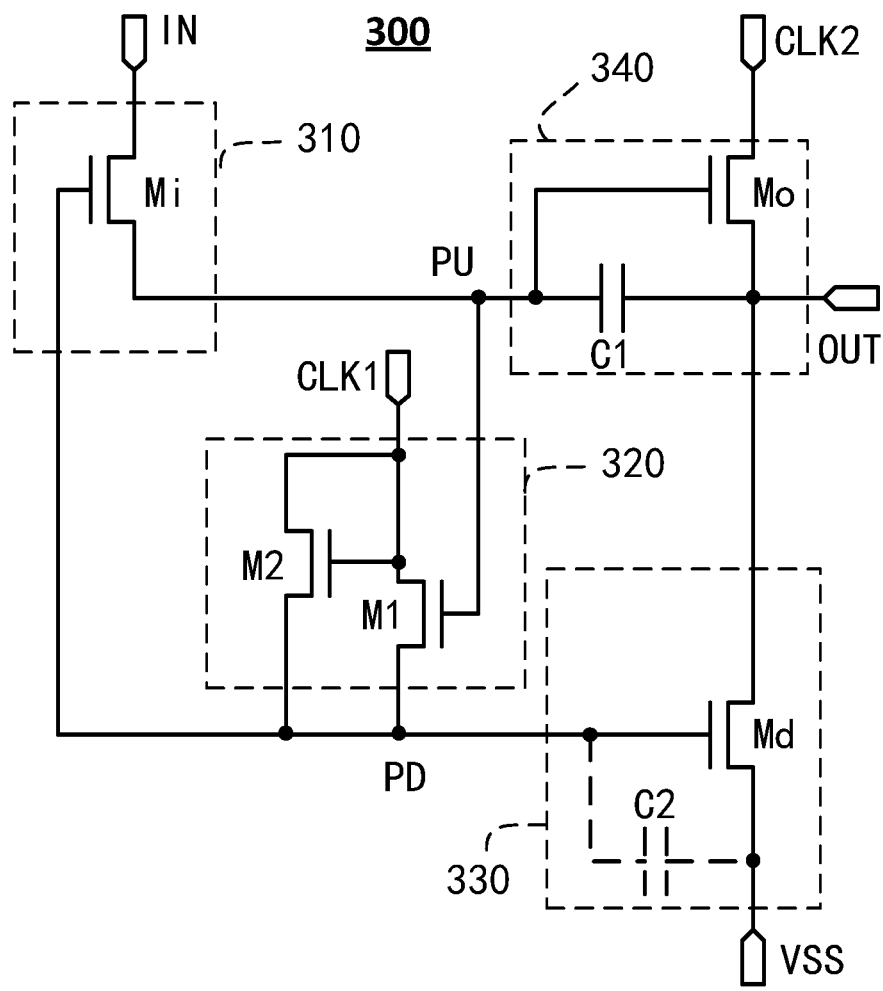
FIG. 3 illustrates a more detailed circuit diagram of a shift register unit according to another embodiment of the present disclosure.

FIG. 3 illustrates a more detailed circuit diagram of the shift register unit 300 according to another embodiment of the present disclosure.

As shown in FIG. 3, the input sub-circuit 310 comprises an input transistor Mi. The input transistor Mi has a control electrode (for example, a gate) electrically coupled to the pull-down node PD, a first electrode (for example, a source) electrically coupled to the input signal terminal IN, and a second electrode (for example, a drain) electrically coupled to the pull-up node PU.

The discharging control sub-circuit 320 comprises a first transistor M1 and a second transistor M2. The first transistor M1 has a control electrode electrically coupled to the pull-up node PU, a first electrode electrically coupled to the first clock signal terminal CLK1, and a second electrode electrically coupled to the pull-down node PD. The second transistor M2 has a control electrode and a first electrode both electrically coupled to the first clock signal terminal CLK1, and a second electrode electrically coupled to the pull-down node PD.

The output sub-circuit 340 comprises an output transistor Mo and a first capacitor C1. The output transistor Mo has a control electrode electrically coupled to the pull-up node PU, a first electrode electrically coupled to the second clock signal terminal CLK2, and a second electrode electrically coupled to the output signal terminal OUT. The first capacitor C1 has one terminal electrically coupled to the pull-up node PU, and the other terminal electrically coupled to the output signal terminal OUT.

The discharging sub-circuit 330 comprises a discharging transistor Md. The discharging transistor Md has a control electrode electrically coupled to the pull-down node PD, a first electrode electrically coupled to the first constant voltage signal terminal VSS, and a second electrode electrically coupled to the output signal terminal OUT.

In some embodiments, the discharging sub-circuit 330 further comprises a second capacitor C2 (shown by broken lines in FIG. 2). In some embodiments, the second capacitor C2 has one terminal electrically coupled to the pull-down node PD, and the other terminal electrically coupled to the first constant voltage signal terminal VSS. The presence of the second capacitor C2 may better keep the voltage at the pull-down node PD unaffected by leakage current.

Figure 4:
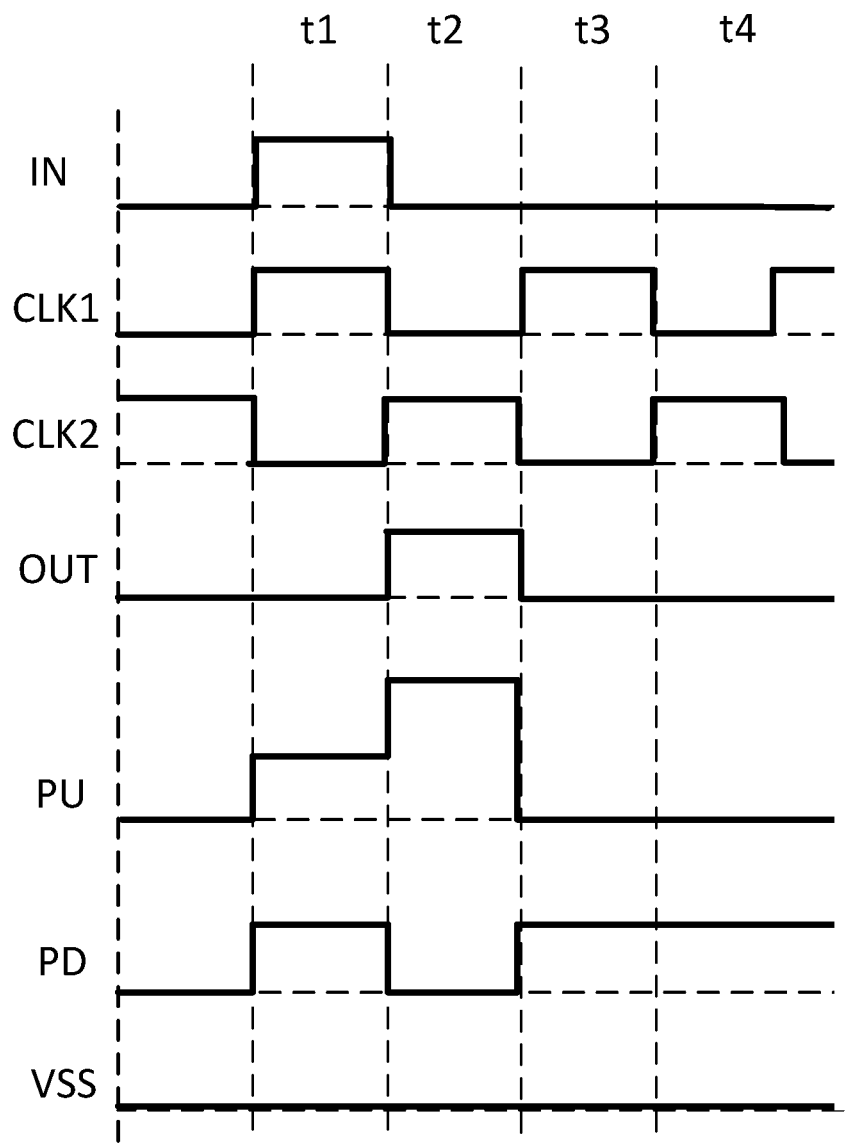
FIG. 4 illustrates a signal timing diagram of the shift register unit shown in FIG. 3.

FIG. 4 illustrates a signal timing diagram of the shift register unit 300 shown in FIG. 3. An operating flow of the shift register unit 300 shown in FIG. 3 will be described below with reference to FIG. 4.

In one frame, an operation timing of the shift register unit 300 may be considered in several phases, i.e., t1, t2, t3, and t4.

During t1, an input signal at the input signal terminal IN has a high level, a first clock signal at the first clock signal terminal CLK1 has a high level, and a second clock signal at the second clock signal terminal CLK2 has a low level. The high level first clock signal causes the second transistor M2 to be turned on, so that the high level first clock signal may be transmitted to the pull-down node PD, and in turn causes the input transistor Mi to be turned on. The input transistor Mi which is turned on enables the high level input signal to be transmitted to the pull-up node PU to charge PU to a first valid level, for example, a high level vgh. PU is at a high level to further causes the first transistor M1 to be turned on, so that the first clock signal may also be transmitted to the pull-down node PD through the first transistor M1.

At this time, both of the pull-up node PU and the pull-down node PD have a high level, which causes both of the output transistor Mo and the discharging transistor Md to be turned on. Thereby, the low level second clock signal and a first constant voltage signal (at a low level vgl) are transmitted to the output signal terminal OUT, so that the output signal terminal OUT outputs a low level output signal. t1 is also called "input phase".

During t2, the input signal has a low level, the first clock signal has a low level, and the second clock signal has a high level. The low level first clock signal causes the second transistor M2 to be turned off, but the pull-up node PU is at a high level, which still causes the first transistor M1 to be turned on, so that the low level first clock signal is transmitted to the pull-down node PD through the first transistor M1. The pull-down node PD is at a low level, which on the one hand, causes the discharging transistor Md to be turned off, so that the low level signal at the first constant voltage signal terminal VSS is no longer transmitted to the output signal terminal OUT; and on the other hand, further causes the input transistor Mi to be turned off, so that the pull-up node PU is floated. At this time, the output transistor Mo is still turned on, the high level second clock signal is transmitted to the output signal terminal OUT and charges the output signal terminal OUT to a high level, for example, vgh, and the output signal terminal OUT outputs a high level output signal. At this time, due to the bootstrap effect of the first capacitor C1, the voltage at the pull-up node PU is raised to a second valid level, which may, for example, be 2vgh in some embodiments. t2 is also called "output phase".

During t3, the input signal has a low level, the first clock signal has a high level, and the second clock signal has a low level. The high level first clock signal causes the second transistor M2 to be turned on again, so that the high level first clock signal may be transmitted to the pull-down node PD, to cause the pull-down node PD to have a high level voltage, and then cause the input transistor Mi to be turned on. The input transistor Mi which is turned on enables the low level input signal to be transmitted to the pull-up node PU to reset PU to an invalid level, for example, the low level vgl. PU is at a low level, which causes the first transistor M1 to be turned off.

At this time, the pull-up node PU has a low level and the pull-down node PD has a high level, which causes the output transistor Mo to be turned off and causes the discharging transistor Md to be turned on. Thereby, the low level second clock signal is transmitted to the output signal terminal OUT, so that the output signal terminal OUT outputs a low level output signal. A process of pulling down the voltage at the pull-up node PU to a low level by the input signal under control of the pull-down node PD is equivalent to a process of resetting the pull-up node PU under control of the reset control signal in the shift register unit shown in FIG. 1, and therefore t3 is also called "reset phase".

During t4, the input signal remains at a low level, and the first clock signal and the second clock signal alternate between a high level and a low level respectively. During a period in which the first clock signal is at a high level, the high level first clock signal may be transmitted to the pull-down node PD through the second transistor M2. At this time, PD has a high level, and the low level input signal is transmitted to the pull-up node PU which is already at a low level under action of the high level at the point PD, so as to de-noise the pull-up node PU. During a period in which the first clock signal is at a low level, the low level first clock signal causes the second transistor M2 to be turned off, and in a case where PU is at a low level, the first transistor M1 is also turned off, so that the pull-down node PD remains at a high level. Thereby, it is easy to cause the pull-up node PU to remain at a low level. In this case, similarly to the phase t3, the output transistor Mo is turned off and the discharging transistor Md is turned on. Thereby, the low level second clock signal is transmitted to the output signal terminal OUT, so that the output signal terminal OUT outputs a low level output signal. The phase t4 is also called "de-noising phase".

It should be illustrated that although duty ratios of the first clock signal and the second clock signal in the timing diagram shown in FIG. 4 are 50%, this is only exemplary. In other embodiments, the duty ratios of the first clock signal and the second clock signal may be greater than or less than 50%, and the technical solutions according to the present disclosure may also be implemented. It should be understood that when the duty ratios of both the first clock signal and the second clock signal may not be 50%, duration of a high level period of the output signal is equal to duration in which a low level period of the first clock signal intersects with a high level period of the second clock signal. A phase and duration of the output signal may be designed by appropriately setting the duty ratios and a phase relationship of the two clock signals.

It should also be illustrated that in FIG. 4, the voltage at the point PD during a period before t1 is shown as being at a low level, but it should be understood that in other embodiments, the voltage at the point PD during the period before t1 may also be shown as being at a high level. For example, when the shift register unit 300 according to the present embodiment is used as an initial shift register unit (which receives a frame start signal as an input signal) in a gate driving circuit, in the timing diagram, the voltage at the point PD during the period before t1 may be shown as being at a low level; and when the shift register unit 300 according to the present embodiment is used as a non-initial shift register unit (which receives an output signal of a previous stage of shift register unit as an input signal of the current stage of shift register unit) in the gate driving circuit, in the timing diagram, the voltage at the point PD during the period before t1 may be shown as being at a high level.

Figure 5:
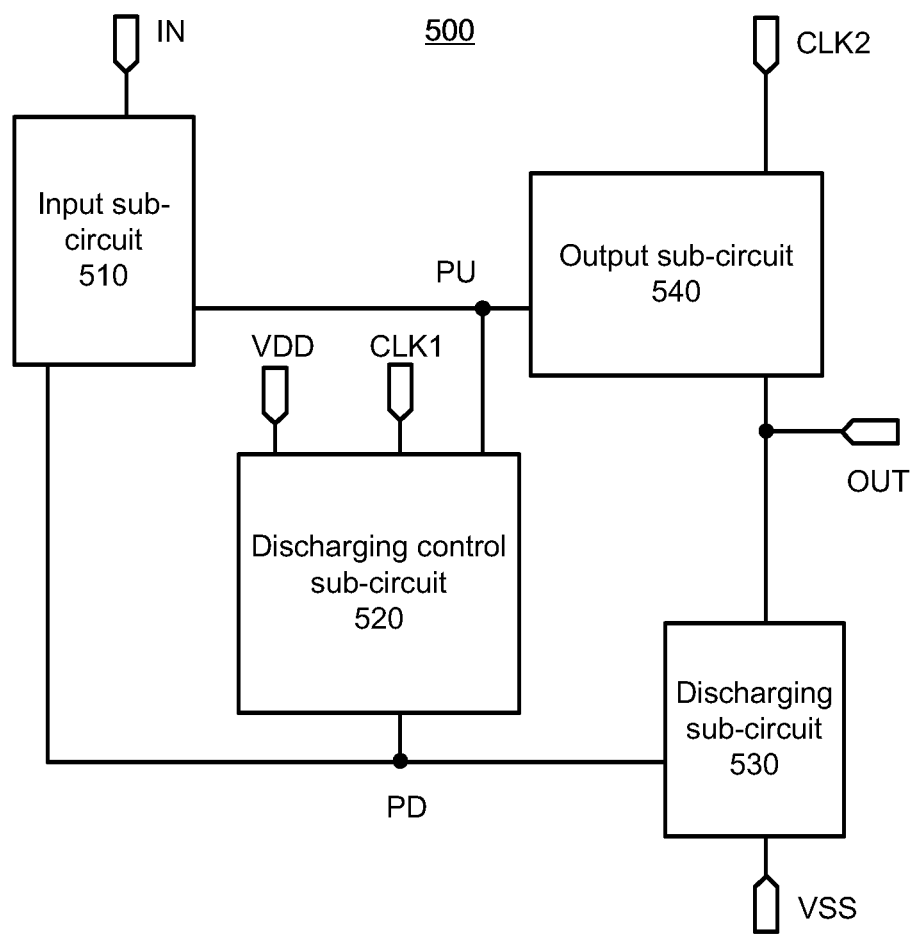
FIG. 5 illustrates a schematic structural diagram of a shift register according to another embodiment of the present disclosure.

FIG. 5 illustrates a schematic structural diagram of a shift register 500 according to another embodiment of the present disclosure.

As shown in FIG. 5, the shift register unit 500 comprises an input sub-circuit 510, a discharging control sub-circuit 520, a discharging sub-circuit 530 and an output sub-circuit 540.

The input sub-circuit 510 is electrically coupled to an input signal terminal IN, a pull-up node PU, and a pull-down node PD. The input sub-circuit 510 is configured to transmit an input signal at the input signal terminal IN to the pull-up node PU under control of a voltage at the pull-down node PD.

The discharging control sub-circuit 520 is electrically coupled to a first clock signal terminal CLK1, the pull-up node PU and the pull-down node PD. The discharging control sub-circuit 520 is configured to transmit a first clock signal at the first clock signal terminal CLK1 to the pull-down node PD under control of the voltage at the pull-up node PU.

The discharging sub-circuit 530 is electrically coupled to the pull-down node PD, a first constant voltage signal terminal VSS, and an output signal terminal OUT. The discharging sub-circuit 530 is configured to transmit a first constant voltage signal at the first constant voltage signal terminal VSS to the output signal terminal OUT under control of the voltage at the pull-down node PD.

The output sub-circuit 540 is electrically coupled to the pull-up node PU, a second clock signal terminal CLK2, and the output signal terminal OUT. The output sub-circuit 540 is configured to transmit a second clock signal at the second clock signal terminal CLK2 to the output signal terminal OUT under control of the voltage at the pull-up node PU.

In some embodiments, the discharging control sub-circuit 520 is further electrically coupled to a second constant voltage signal terminal VDD, and the discharging control sub-circuit 520 is further configured to transmit a second constant voltage signal (for example, a high level vgh) at the second constant voltage signal terminal VDD to the pull-down node PD under control of the first clock signal.

Figure 6:
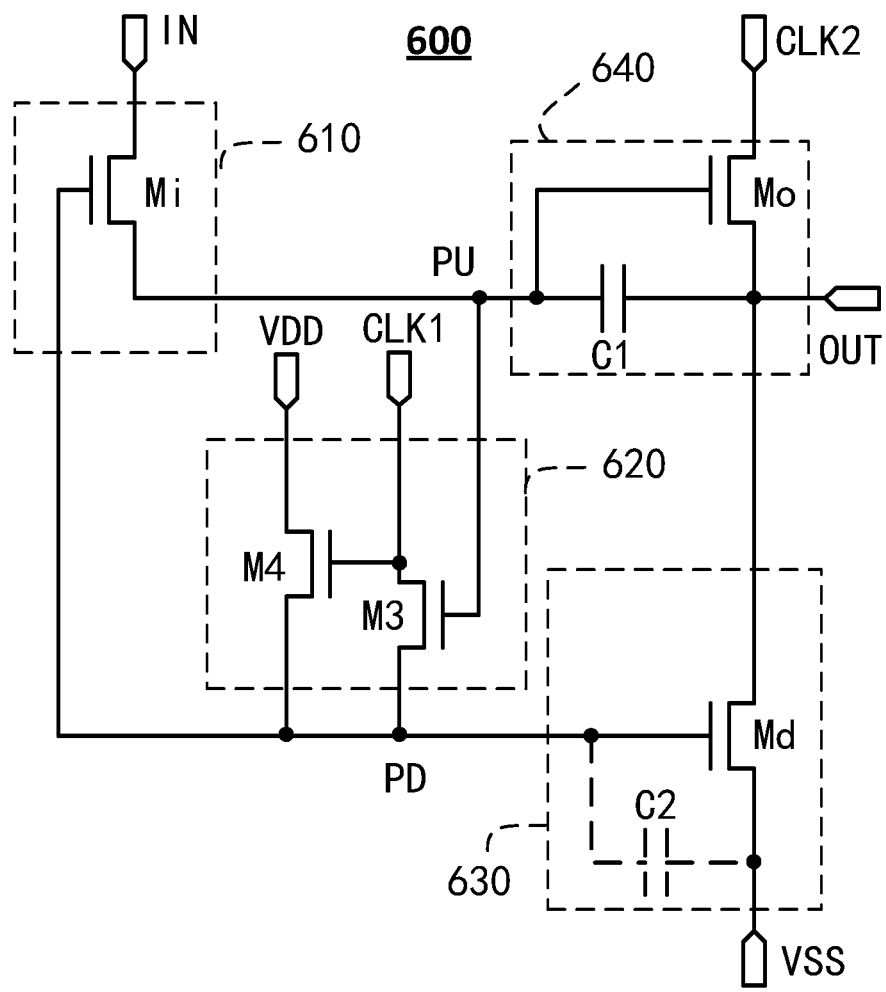
FIG. 6 illustrates a more detailed circuit diagram of a shift register unit according to another embodiment of the present disclosure.

FIG. 6 illustrates a more detailed circuit diagram of the shift register unit 600 according to another embodiment of the present disclosure.

As shown in FIG. 6, the input sub-circuit 610 comprises an input transistor Mi. The input transistor Mi has a control electrode (for example, a gate) electrically coupled to the pull-down node PD, a first electrode (for example, a source) electrically coupled to the input signal terminal IN, and a second electrode (for example, a drain) electrically coupled to the pull-up node PU.

The discharging control sub-circuit 620 comprises a third transistor M3 and a fourth transistor M4. The third transistor M3 has a control electrode electrically coupled to the pull-up node PU, a first electrode electrically coupled to the first clock signal terminal CLK1, and a second electrode electrically coupled to the pull-down node PD. The fourth transistor M4 has a control electrode electrically coupled to the first clock signal terminal CLK1, a first electrode electrically coupled to the second constant voltage signal terminal VDD, and a second electrode electrically coupled to the pull-down node PD.

The output sub-circuit 640 comprises an output transistor Mo and a first capacitor C1. The output transistor Mo has a control electrode electrically coupled to the pull-up node PU, a first electrode electrically coupled to the second clock signal terminal CLK2, and a second electrode electrically coupled to the output signal terminal OUT. The first capacitor C1 has one terminal electrically coupled to the pull-up node PU, and the other terminal electrically coupled to the output signal terminal OUT.

The discharging sub-circuit 630 comprises a discharging transistor Md. The discharging transistor Md has a control electrode electrically coupled to the pull-down node PD, a first electrode electrically coupled to the first constant voltage signal terminal VSS, and a second electrode electrically coupled to the output signal terminal OUT.

In some embodiments, the discharging sub-circuit 630 further comprises a second capacitor C2 (shown by broken lines in FIG. 5). In some embodiments, the second capacitor C2 has one terminal electrically coupled to the pull-down node PD, and the other terminal electrically coupled to the first constant voltage signal terminal VSS. The presence of the second capacitor C2 may better keep the voltage at the pull-down node PD unaffected by leakage current.

Figure 7:
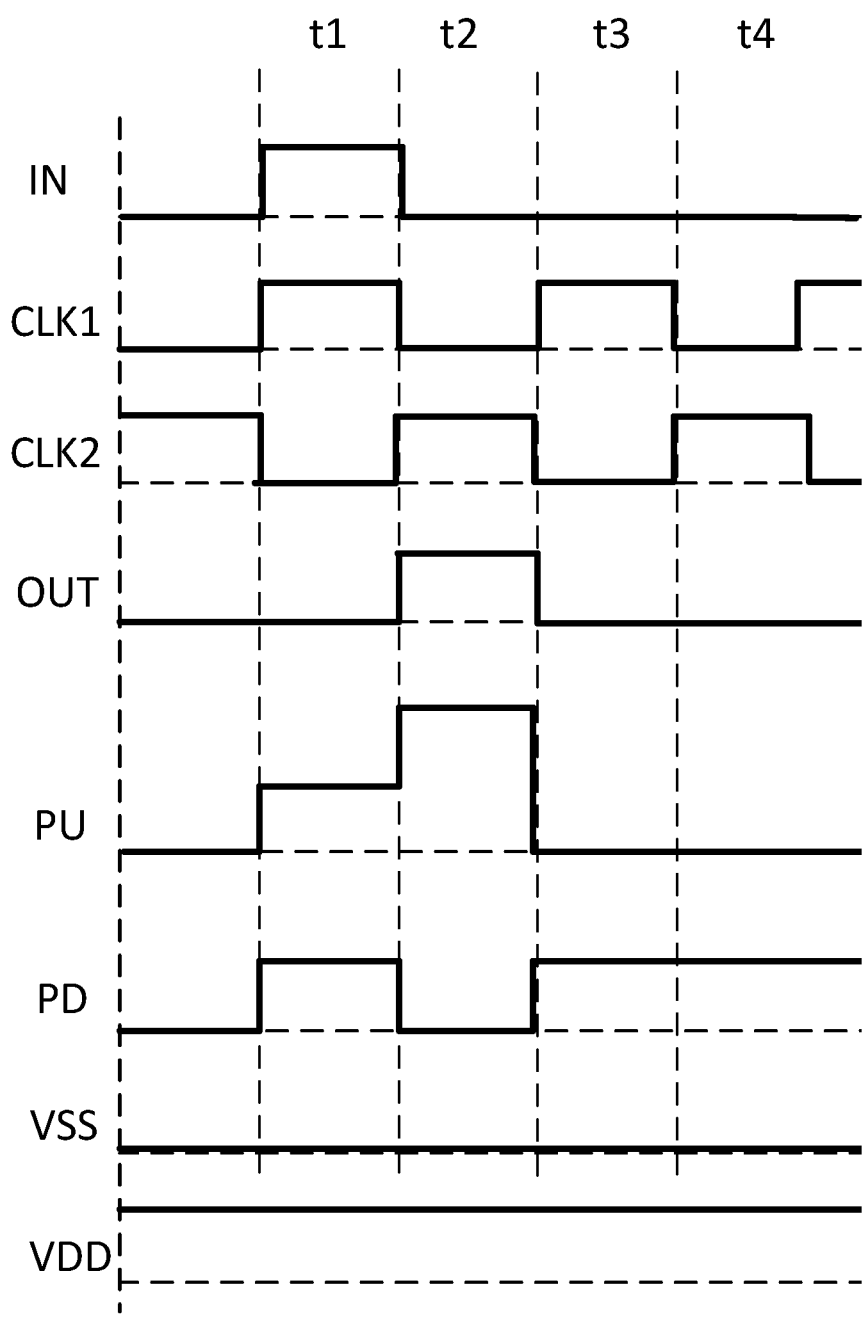
FIG. 7 illustrates a signal timing diagram of the shift register unit shown in FIG. 6.

FIG. 7 illustrates a signal timing diagram of the shift register unit 600 shown in FIG. 6. An operating flow of the shift register unit 600 shown in FIG. 6 will be described below with reference to FIG. 7.

In one frame, an operation timing of the shift register unit 600 may be considered in several phases, i.e., t1, t2, t3, and t4.

During t1, an input signal at the input signal terminal IN has a high level, a first clock signal at the first clock signal terminal CLK1 has a high level, and a second clock signal at the second clock signal terminal CLK2 has a low level. The high level first clock signal causes the fourth transistor M4 to be turned on, so that the high level signal at the second constant clock signal terminal VDD may be transmitted to the pull-down node PD, and in turn causes the input transistor Mi to be turned on. The input transistor Mi which is turned on enables the high level input signal to be transmitted to the pull-up node PU to charge PU to a first valid level, for example, a high level vgh. PU is at a high level to further causes the third transistor M3 to be turned on, so that the first clock signal may also be transmitted to the pull-down node PD through the third transistor M3.

At this time, both of the pull-up node PU and the pull-down node PD have a high level, which causes both of the output transistor Mo and the discharging transistor Md to be turned on. Thereby, the low level second clock signal and a first constant voltage signal (at a low level vgl) are transmitted to the output signal terminal OUT, so that the output signal terminal OUT outputs a low level output signal. t1 is also called "input phase".

During t2, the input signal has a low level, the first clock signal has a low level, and the second clock signal has a high level. The low level first clock signal causes the fourth transistor M4 to be turned off, but the pull-up node PU is at a high level, which still causes the third transistor M3 to be turned on, so that the low level first clock signal is transmitted to the pull-down node PD through the third transistor M3. The pull-down node PD is at a low level, which on the one hand, causes the discharging transistor Md to be turned off, so that the low level signal at the first constant voltage signal terminal VSS is no longer transmitted to the output signal terminal OUT; and on the other hand, further causes the input transistor Mi to be turned off, so that the pull-up node PU is floated. At this time, the output transistor Mo is still turned on, the high level second clock signal is transmitted to the output signal terminal OUT and charges the output signal terminal OUT to a high level, for example, vgh, and the output signal terminal OUT outputs a high level output signal. At this time, due to the bootstrap effect of the first capacitor C1, the voltage at the pull-up node PU is raised to a second valid level, which may, for example, be 2vgh in some embodiments. t2 is also called "output phase".

During t3, the input signal has a low level, the first clock signal has a high level, and the second clock signal has a low level. The high level first clock signal causes the fourth transistor M4 to be turned on again, so that the high level signal at the second constant voltage signal terminal VDD may be transmitted to the pull-down node PD, to cause the pull-down node PD to have a high level voltage, and then cause the input transistor Mi to be turned on. The input transistor Mi which is turned on enables the low level input signal to be transmitted to the pull-up node PU to reset PU to an invalid level, for example, the low level vgl. PU is at a low level, which causes the third transistor M3 to be turned off.

At this time, the pull-up node PU has a low level and the pull-down node PD has a high level, which causes the output transistor Mo to be turned off and causes the discharging transistor Md to be turned on. Thereby, the low level second clock signal is transmitted to the output signal terminal OUT, so that the output signal terminal OUT outputs a low level output signal. A process of pulling down the voltage at the pull-up node PU to a low level by the input signal under control of the pull-down node PD is equivalent to a process of resetting the pull-up node PU under control of the reset control signal in the shift register unit shown in FIG. 1, and therefore t3 is also called "reset phase".

During t4, the input signal remains at a low level, and the first clock signal and the second clock signal alternate between a high level and a low level respectively. During a period in which the first clock signal is at a high level, the high level signal at the second constant voltage signal terminal VDD may be transmitted to the pull-down node PD through the fourth transistor M4. At this time, PD has a high level, and the low level input signal is transmitted to the pull-up node PU which is already at a low level under action of the high level at the point PD, so as to de-noise the pull-up node PU. During a period in which the first clock signal is at a low level, the low level first clock signal causes the fourth transistor M4 to be turned off, and in a case where PU is at a low level, the third transistor M3 is also turned off, so that the pull-down node PD remains at a high level. Thereby, it is easy to cause the pull-up node PU to remain at a low level. In this case, similarly to the phase t3, the output transistor Mo is turned off and the discharging transistor Md is turned on. Thereby, the low level second clock signal is transmitted to the output signal terminal OUT, so that the output signal terminal OUT outputs a low level output signal. The phase t4 is also called "de-noising phase".

It should be illustrated that although duty ratios of the first clock signal and the second clock signal in the timing diagram shown in FIG. 7 are 50%, this is only exemplary. In other embodiments, the duty ratios of the first clock signal and the second clock signal may be greater than or less than 50%, and the technical solutions according to the present disclosure may also be implemented. It should be understood that when the duty ratios of both the first clock signal and the second clock signal may not be 50%, duration of a high level period of the output signal is equal to duration in which a low level period of the first clock signal intersects with a high level period of the second clock signal. A phase and duration of the output signal may be designed by appropriately setting the duty ratios and a phase relationship of the two clock signals.

It should also be illustrated that in FIG. 7, the voltage at the point PD during a period before t1 is shown as being at a low level, but it should be understood that in other embodiments, the voltage at the point PD during the period before t1 may also be shown as being at a high level. For example, when the shift register unit 600 according to the present embodiment is used as an initial shift register unit (which receives a frame start signal as an input signal) in a gate driving circuit, in the timing diagram, the voltage at the point PD during the period before t1 may be shown as being at a low level; and when the shift register unit 600 according to the present embodiment is used as a non-initial shift register unit (which receives an output signal of a previous stage of shift register unit as an input signal of the current stage of shift register unit) in the gate driving circuit, in the timing diagram, the voltage at the point PD during the period before t1 may be shown as being at a high level.

Figure 8:
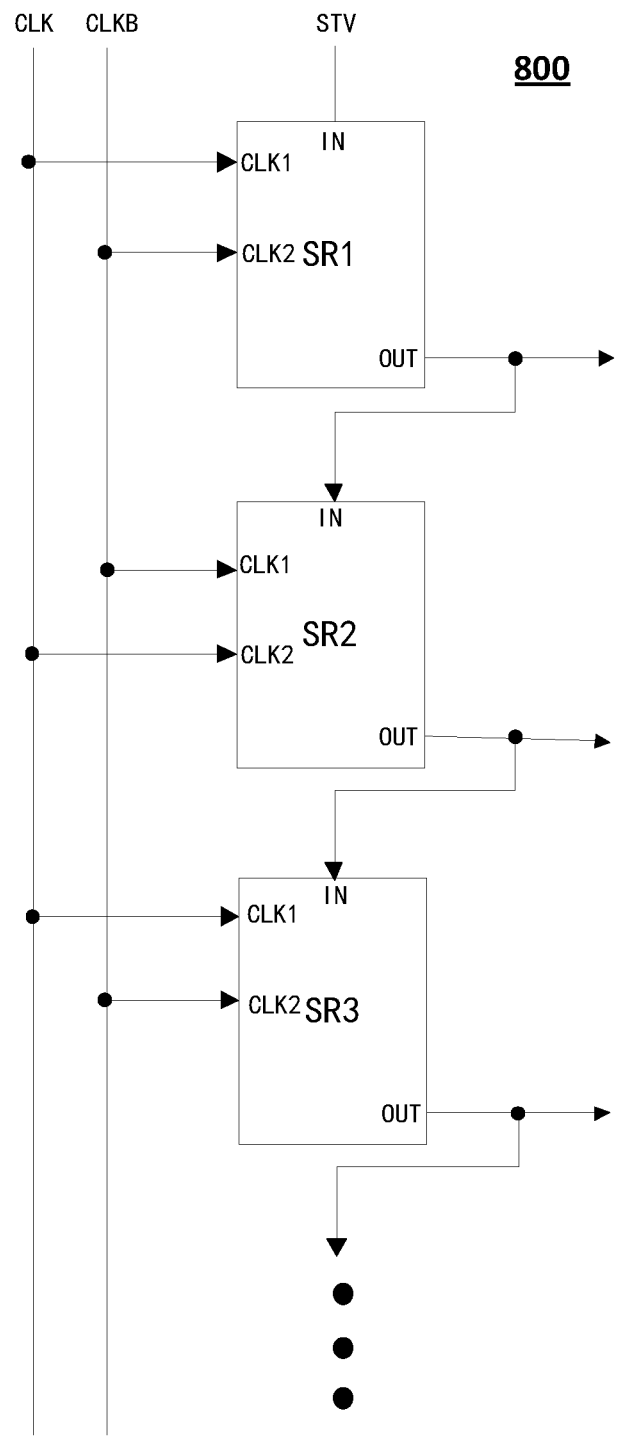
FIG. 8 illustrates a cascaded structural diagram of a gate driving circuit according to an embodiment of the present disclosure.

FIG. 8 illustrates a cascaded structural diagram of a gate driving circuit 800 according to an embodiment of the present disclosure. The gate driving circuit 800 comprises a plurality of cascaded shift register units (for example, SR1, SR2, SR3) according to any of the above embodiments, and each of these shift register units may be implemented using the shift register unit 200, 300, 500 or 600. Here, a first stage of shift register unit SR1 receives a frame start signal STV as an input signal received at an input signal terminal IN thereof. Except for the first stage of shift register unit, each stage of shift register unit (for example, SR2 and SR3) receives an output signal from an output signal terminal OUT of a previous stage of shift register unit as an input signal of the current stage of shift register unit.

As shown in FIG. 8, a first clock signal terminal CLK1 of each stage of shift register unit is coupled to one of a first clock signal line CLK and a second clock signal line CLKB, and a second clock signal terminal CLK2 of each stage of shift register unit is coupled to the other of the first clock signal line CLK and the second clock signal line CLKB.

In some embodiments, first clock signal terminals in adjacent two stages of shift register units are coupled to different clock signal lines. For example, first clock signal terminals CLK1 of SR1 and SR2 shown in FIG. 8 are coupled to CLK and CLKB respectively.

In some embodiments, a duty ratio of the frame start signal STV is adjustable. In some embodiments, duration of a valid level period of STV may be longer than that of a valid level period of the input signal as shown in FIG. 4 or FIG. 7.

Figure 9:
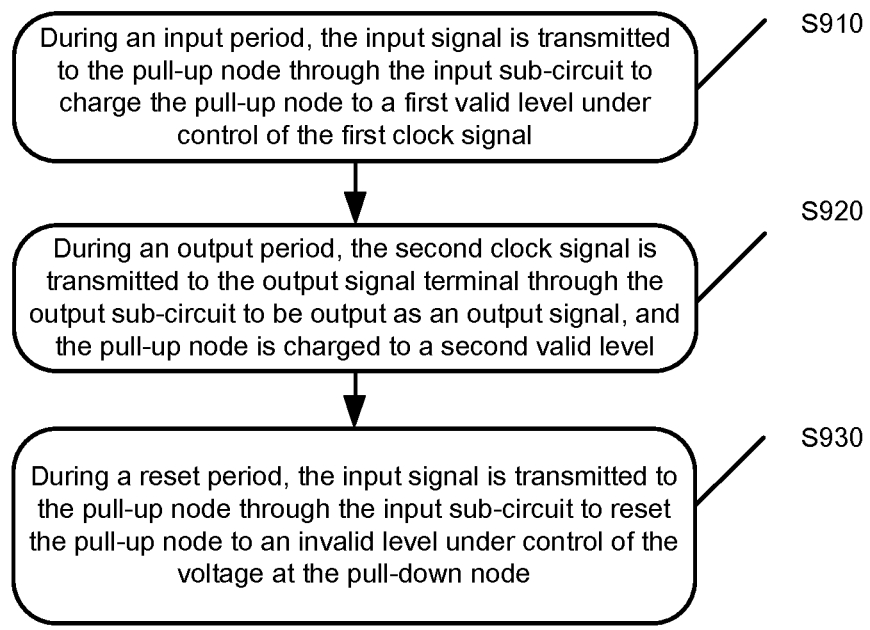
FIG. 9 illustrates a flowchart of a method for driving a shift register unit according to an embodiment of the present disclosure.

FIG. 9 illustrates a flowchart of a method 900 for driving a shift register unit according to an embodiment of the present disclosure. It should be understood that the driving method 900 may be used to drive the shift register unit 200, 300, 500, or 600 as described above. Therefore, in the following description of the method, the explanation and description made above in conjunction with FIGS. 2 to 7 are also applicable here, and will not be repeated.

The driving method comprises steps S910 to S930.

In S910, during an input period, the input signal is transmitted to the pull-up node through the input sub-circuit to charge the pull-up node to a first valid level under control of the first clock signal.

In S920, during an output period, the second clock signal is transmitted to the output signal terminal through the output sub-circuit to be output as an output signal, and the pull-up node is charged to a second valid level.

In S930, during a reset period, the input signal is transmitted to the pull-up node through the input sub-circuit to reset the pull-up node to an invalid level under control of the voltage at the pull-down node.

In some embodiments, the method 900 further comprises: after the reset period, causing the input signal to be maintained to be transmitted to the pull-up node to continuously de-noise the pull-up node under control of the voltage at the pull-down node.

Figure 10:
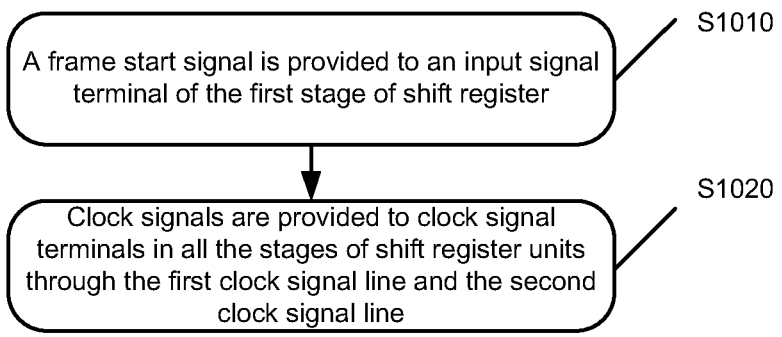
FIG. 10 illustrates a flowchart of a method for driving a gate driving circuit according to an embodiment of the present disclosure.

FIG. 10 illustrates a flowchart of a method 1000 for driving a gate driving circuit according to an embodiment of the present disclosure. It should be understood that the driving method 1000 may be used to drive the gate driving circuit 800 as described above. Therefore, in the following description of the method, the explanation and description made above in conjunction with FIG. 8 are also applicable here, and will not be repeated.

The driving method comprises steps S1010 to S1020.

In S1010, a frame start signal is provided to an input signal terminal of the first stage of shift register.

In S1020, clock signals are provided to clock signal terminals in all the stages of shift register units through the first clock signal line and the second clock signal line.

In some embodiments, a phase of a signal from the first clock signal line differs from a phase of a signal from the second clock signal line by a half of a clock cycle.

In some embodiments, a first edge of a clock signal provided to a first clock signal terminal of the first stage of shift register during a first cycle is synchronized with a first edge of the frame start signal.

Figure 11:
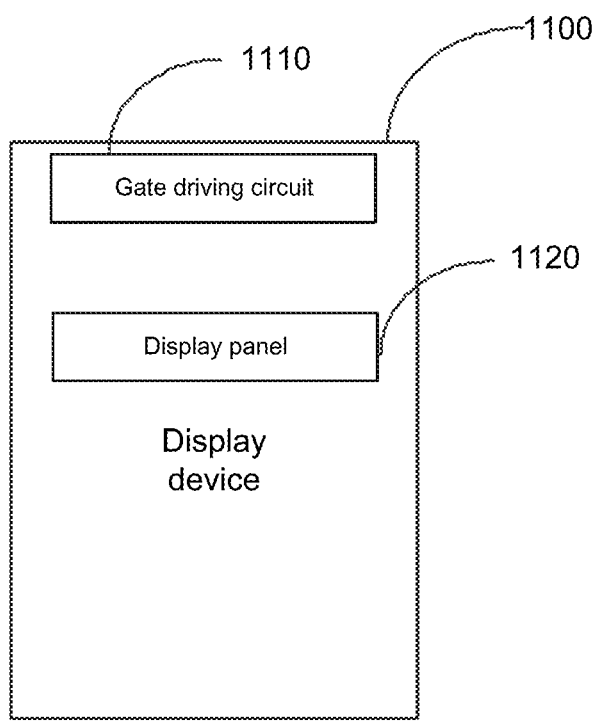
FIG. 11 illustrates a schematic block diagram of a display apparatus according to an embodiment of the present disclosure.

FIG. 11 illustrates a schematic block diagram of a display apparatus according to an embodiment of the present disclosure. As shown in FIG. 11, the display apparatus 1100 comprises a gate driving circuit 1110 and a display panel 1120. The gate driving circuit 1110 may be implemented by the gate driving circuit according to any of the embodiments of the present disclosure. The display apparatus 1100 according to the embodiment of the present disclosure may be any product or component having a display function such as an electronic paper, a mobile phone, a tablet computer, a television, a display, a notebook computer, a digital photo frame, a navigator, etc.

In the circuit structure of the shift register unit (for example, the shift register unit 100 in FIG. 1) in the related art, various functional units (for example, inputting, discharging, resetting, and de-noising etc.) in the circuit are implemented by multiple different thin film transistors, and the larger the number of the thin film transistors, the larger the space of the panel occupied by the thin film transistors, which is not conducive to the design of a narrow border. In addition, connections between the pull-down node and the high level signal terminal VDD and the low level signal terminal VSS of the shift register unit (for example, the shift register unit 100 in FIG. 1) in the related art may be turned on at the same time, and there is short circuit current in the circuit structure, which is not conducive to the realization of low power consumption. With the shift register unit and the method for driving the same, the gate driving circuit and the method for driving the same, and the display apparatus described above according to the embodiments of the present disclosure, many functions are realized through one transistor, i.e., the input transistor, under control of the voltage at the pull-down node PD, thereby reducing a number of transistors used, which is more conducive to the realization of the narrow border. In addition, in the present disclosure, the pull-down node is isolated from the low level signal terminal VSS, and there is no short-circuit current, which is conducive to the realization of low power consumption.

In the above detailed description, many embodiments have been explained by using schematic diagrams, flowcharts and/or examples. In a case where such schematic diagrams, flowcharts, and/or examples comprise one or more functions and/or operations, it should be understood by those skilled in the art that each function and/or operation in such schematic diagrams, flowcharts, or examples may be realized individually and/or jointly by various structures, hardware, software, firmware, or substantially any combination thereof.

Although the present disclosure has been described with reference to several exemplary embodiments, it should be understood that the terms used are illustrative and exemplary rather than limiting. Since the present disclosure may be embodied in various forms without departing from the spirit or essence of the present disclosure, it should be understood that the above embodiments are not limited to any of the foregoing details, but should be widely interpreted within the spirit and scope defined by the appended claims. Therefore, all changes and variations falling within the scope of the claims or their equivalents should be covered by the appended claims.

We claim:

1. A method for driving a shift register unit, the shift register unit comprising:
an input sub-circuit electrically coupled to an input signal terminal, a first node and a second node, and configured to transmit an input signal at the input signal terminal to the first node under control of a voltage at the second node,
a discharging control sub-circuit electrically coupled to a first clock signal terminal, the first node and the second node, and configured to transmit a first clock signal at the first clock signal terminal to the second node under control of a voltage at the first node,
a discharging sub-circuit electrically coupled to the second node, a first constant voltage signal terminal and an output signal terminal, and configured to transmit a first constant voltage signal at the first constant voltage signal terminal to the output signal terminal under control of the voltage at the second node, and
an output sub-circuit electrically coupled to the first node, a second clock signal terminal and the output signal terminal, and configured to transmit a second clock signal at the second clock signal terminal to the output signal terminal under control of the voltage at the first node,
wherein the discharging control sub-circuit comprises a first transistor and a second transistor, the first transistor has a control electrode electrically coupled to the first node, a first electrode electrically coupled to the first clock signal terminal, and a second electrode electrically coupled to the second node, and the second transistor has a second electrode electrically coupled to the second node,
the method comprising:
during an input period, transmitting the input signal to the first node through the input sub-circuit to charge the first node to a first valid level under control of the first clock signal;
during an output period, transmitting the second clock signal to the output signal terminal through the output sub-circuit to be output as an output signal, and charging the first node to a second valid level; and
during a reset period, transmitting the input signal to the first node through the input sub-circuit to reset the first node to an invalid level under control of the voltage at the second node.

2. The method according to claim 1, wherein after the reset period, the input signal is maintained to be transmitted to the first node to continuously de-noise the first node under control of the voltage at the second node.

3. The method according to claim 1, wherein,
the input sub-circuit comprises an input transistor, the input transistor has a control electrode electrically coupled to the second node, a first electrode electrically coupled to the input signal terminal, and a second electrode electrically coupled to the first node,
the output sub-circuit comprises an output transistor and a first capacitor, the output transistor has a control electrode electrically coupled to the first node, a first electrode electrically coupled to the second clock signal terminal, and a second electrode electrically coupled to the output signal terminal, and the first capacitor has one terminal electrically coupled to the first node, and the other terminal electrically coupled to the output signal terminal, and
the discharging sub-circuit comprises a discharging transistor and a second capacitor, the discharging transistor has a control electrode electrically coupled to the second node, a first electrode electrically coupled to the first constant voltage signal terminal, and a second electrode electrically coupled to the output signal terminal, and the second capacitor has one terminal electrically coupled to the second node, and the other terminal electrically coupled to the first constant voltage signal terminal.

4. The method according to claim 1, wherein the discharging control sub-circuit is further configured to transmit the first clock signal to the second node under control of the first clock signal.

5. The method according to claim 4, wherein
the second transistor has a control electrode and a first electrode both electrically coupled to the first clock signal terminal.

6. The method according to claim 1, wherein the discharging control sub-circuit is further electrically coupled to a second constant voltage signal terminal, and is further configured to transmit a second constant voltage signal at the second constant voltage signal terminal to the second node under control of the first clock signal.

7. The method according to claim 6, wherein
the second transistor has a control electrode electrically coupled to the first clock signal terminal, a first electrode electrically coupled to the second constant voltage signal terminal.

8. The method according to claim 1, wherein the input sub-circuit comprises an input transistor, wherein
the input transistor has a control electrode electrically coupled to the second node, a first electrode electrically coupled to the input signal terminal, and a second electrode electrically coupled to the first node.

9. The method according to claim 1, wherein the output sub-circuit comprises an output transistor and a first capacitor, wherein
the output transistor has a control electrode electrically coupled to the first node, a first electrode electrically coupled to the second clock signal terminal, and a second electrode electrically coupled to the output signal terminal, and
the first capacitor has one terminal electrically coupled to the first node, and the other terminal electrically coupled to the output signal terminal.

10. The method according to claim 1, wherein the discharging star-circuit comprises a discharging transistor, wherein
the discharging transistor has a control electrode electrically coupled to the second node, a first electrode electrically coupled to the first constant voltage signal terminal, and a second electrode electrically coupled to the output signal terminal.

11. The method according to claim 10, wherein the discharging sub-circuit further comprises a second capacitor, wherein
the second capacitor has one terminal electrically coupled to the second node, and the other terminal electrically coupled to the first constant voltage signal terminal.

12. A method for driving a gate driving circuit comprising a plurality of cascaded shift register units, each of the cascade shift register units comprising:
- an input sub-circuit electrically coupled to an input signal terminal, a first node and a second node, and configured to transmit an input signal at the input signal terminal to the first node under control of a voltage at the second node,
- a discharging control sub-circuit electrically coupled to a first clock signal terminal, the first node and the second node, and configured to transmit a first clock signal at the first clock signal terminal to the second node under control of a voltage at the first node,
- a discharging sub-circuit electrically coupled to the second node, a first constant voltage signal terminal and an output signal terminal, and configured to transmit a first constant voltage signal at the first constant voltage signal terminal to the output signal terminal under control of the voltage at the second node, and
- an output sub-circuit electrically coupled to the first node, a second clock signal terminal and the output signal terminal, and configured to transmit a second clock signal at the second clock signal terminal to the output signal terminal under control of the voltage at the first node,
- wherein the discharging control sub-circuit comprises a first transistor and a second transistor, the first transistor has a control electrode electrically coupled to the first node, a first electrode electrically coupled to the first clock signal terminal, and a second electrode electrically coupled to the second node, and the second transistor has a second electrode electrically coupled to the second node, and wherein except for a first stage of shift register unit, each stage of shift register unit receives an output signal from an output signal terminal of a previous stage of shift register unit as an input signal of a current stage of shift register unit, and the first stage of shift register unit receives a frame start signal as an input signal, and a first clock signal terminal of each stage of shift register unit is coupled to one of a first clock signal line and a second clock signal line, and a second clock signal terminal of each stage of shift register unit is coupled to the other of the first clock signal line and the second clock signal line, wherein first clock signal terminals in adjacent two stages of shift register units are coupled to different clock signal lines, the method comprising:

providing a flame start signal to an input signal terminal of the first stage of shift register; and providing clock signals to clock signal terminals in all the stages of shift register units through the first clock signal line and the second clock signal line, wherein a phase of a signal from the first clock signal line differs from a phase of a signal from the second clock signal line by a half of a clock cycle, and a first edge of a clock signal provided to a first clock signal terminal of the first stage of shift register during a first cycle is synchronized with a first edge of the frame start signal.

13. The method according to claim 12, wherein a duty ratio of the flame start signal is adjustable.

* * * * *